(12) United States Patent
Joos et al.

(10) Patent No.: US 9,712,157 B2
(45) Date of Patent: Jul. 18, 2017

(54) CONTROL OF A HALF-BRIDGE

(71) Applicant: Robert Bosch GmbH, Stuttgart (DE)

(72) Inventors: Joachim Joos, Stuttgart (DE); Werner Schiemann, Fellbach (DE); Martin Haug, Shanghai (CN)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 14/891,546

(22) PCT Filed: Mar. 11, 2014

(86) PCT No.: PCT/EP2014/054668
§ 371 (c)(1),
(2) Date: Nov. 16, 2015

(87) PCT Pub. No.: WO2014/183900
PCT Pub. Date: Nov. 20, 2014

(65) Prior Publication Data
US 2016/0126946 A1  May 5, 2016

(30) Foreign Application Priority Data
May 14, 2013 (DE) .................. 10 2013 208 813

(51) Int. Cl.
*H03K 17/687* (2006.01)
*H02M 1/08* (2006.01)
(Continued)

(52) U.S. Cl.
CPC .......... *H03K 17/687* (2013.01); *H02M 1/08* (2013.01); *H02M 1/38* (2013.01); *H02P 7/04* (2016.02);
(Continued)

(58) Field of Classification Search
None
See application file for complete search history.

(56) References Cited

U.S. PATENT DOCUMENTS 6,288,595 B1 * 9/2001 Hirakata ................. H02M 1/38
327/424
6,396,250 B1 * 5/2002 Bridge ................ H02M 3/1588
323/283
(Continued)

FOREIGN PATENT DOCUMENTS

DE       10032321       1/2001
EP       1691478        8/2006
(Continued)

OTHER PUBLICATIONS

International Search Report for PCT/EP2014/054668, issued on May 13, 2015.

*Primary Examiner* — Thomas J Hiltunen
(74) *Attorney, Agent, or Firm* — Norton Rose Fulbright US LLP; Gerard Messina

(57) ABSTRACT

A control for an electrical consumer includes a first switching device for connecting an output for the consumer to a first potential, a second switching device for connecting the output to a second potential, a control device for activating the switching devices, a first scanning device for providing a first signal as a function of a switching state of the first switching device, a second scanning device for providing a second signal as a function of a switching state of the second switching device, and a comparator device for determining a difference in the switch-on times of the switching devices on the basis of the determined signals.

10 Claims, 3 Drawing Sheets

(51) Int. Cl.
*H02M 1/38* (2007.01)
*H03K 17/16* (2006.01)
*H03K 17/18* (2006.01)
*H02P 7/03* (2016.01)
*H02M 1/00* (2006.01)

(52) U.S. Cl.
CPC ........... *H03K 17/165* (2013.01); *H03K 17/18* (2013.01); *H02M 2001/0003* (2013.01); *H02M 2001/0009* (2013.01)

(56) References Cited

U.S. PATENT DOCUMENTS

| | | | | |
|---|---|---|---|---|
| 6,958,592 | B2 * | 10/2005 | Chapuis | H02M 1/38 323/246 |
| 7,205,821 | B2 * | 4/2007 | Rutter | H02M 1/38 327/108 |
| 7,446,513 | B2 * | 11/2008 | Dikken | H02M 1/38 323/271 |
| 7,456,620 | B2 * | 11/2008 | Maksimovic | H02M 1/38 323/246 |
| 7,629,782 | B2 * | 12/2009 | Naka | H02M 3/157 323/271 |
| 7,683,594 | B2 * | 3/2010 | Kim | H02M 1/38 323/282 |
| 8,502,304 | B2 * | 8/2013 | Hashimoto | H01L 23/49562 257/328 |
| 8,933,679 | B2 * | 1/2015 | Zhak | G05F 3/08 323/222 |
| 9,094,006 | B2 * | 7/2015 | Gravati | H03K 17/082 |
| 9,130,552 | B2 * | 9/2015 | Gupta | H03K 5/15 |
| 2005/0110475 | A1 | 5/2005 | Chapuis | |
| 2015/0188428 | A1 * | 7/2015 | Leung | H02M 3/156 323/271 |

FOREIGN PATENT DOCUMENTS

| | | |
|---|---|---|
| JP | S63316514 A | 12/1988 |
| JP | 2003088113 A | 3/2003 |

* cited by examiner

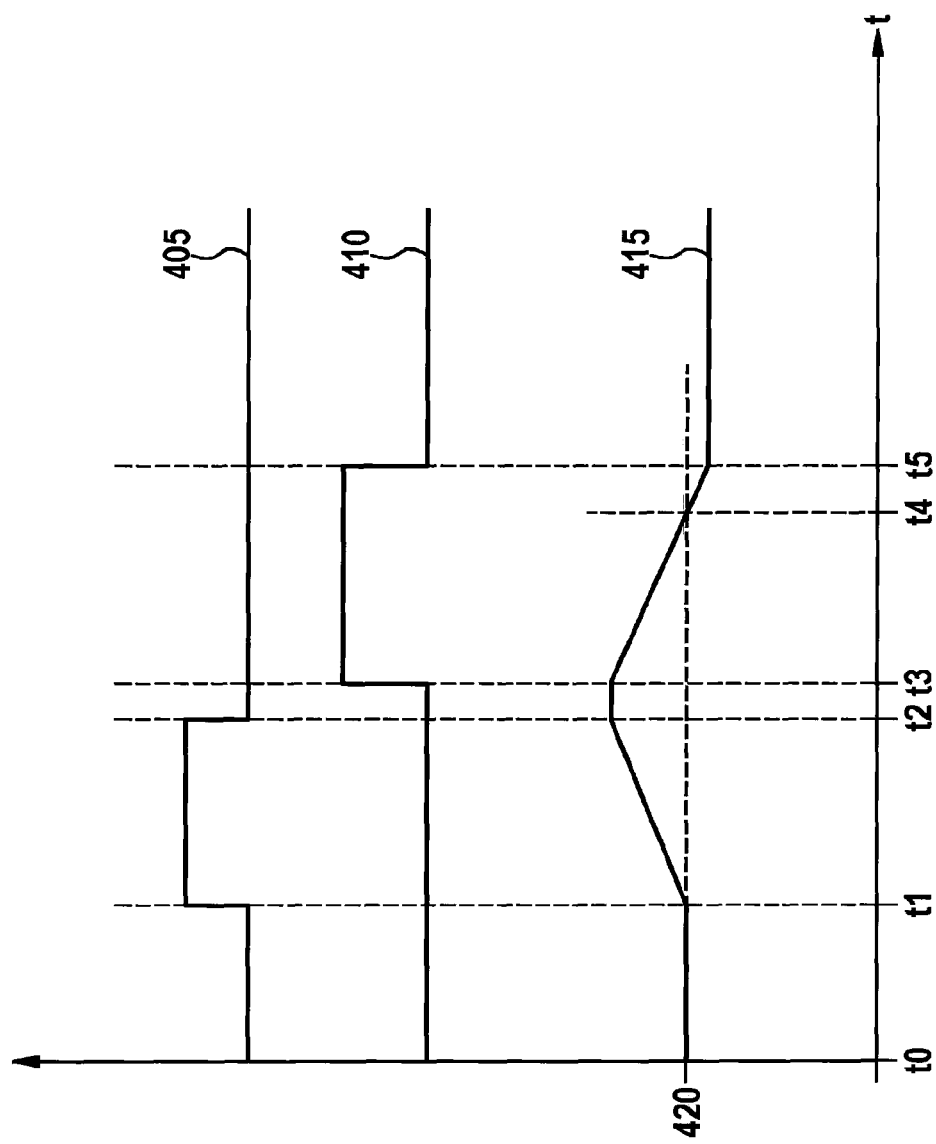

CONTROL OF A HALF-BRIDGE

FIELD OF THE INVENTION

The present invention relates to control of a half-bridge. In particular the present invention relates to a control device for controlling a consumer with the aid of a half-bridge.

BACKGROUND INFORMATION

An electrical consumer may be controlled with the aid of a half-bridge, which includes a first switching device for connecting the consumer to a positive potential and a second switching device for connecting the consumer to a negative potential. A second terminal of the consumer is usually at a predetermined potential, in particular ground, or may be controlled in a corresponding manner but with reverse polarity with the aid of an additional half-bridge. Some consumers, for example, brushless d.c. motors or polyphase three-phase a.c. motors, may require additional half-bridges.

A control device is configured to always activate only one of the two switching devices to connect the consumer to the particular desired potential. For example, latency times between activating one of the switching devices and enabling a current flow through the switching device may vary due to manufacturing tolerances or temperature influences on the switching devices. The potential averaged over time and supplied to the consumer through the half-bridge may therefore deviate from a predetermined potential. In other words, a current through the consumer may have a predetermined offset. In particular when the consumer includes an inductive or capacitive consumer, this shift may result in increased losses and increased stresses on the switching devices or on the electrical consumer.

The object of the present invention is therefore to provide a control for an electrical consumer, which allows improved control of the half-bridge. The present invention achieves this object with the aid of a control.

SUMMARY

A control according to the present invention for an electrical consumer includes a first switching device for connecting an output for the consumer to a first potential, a second switching device for connecting the output to a second potential, a control device for activating the switching devices, a first scanning device for supplying a first signal as a function of a switching state of the first switching device, a second scanning device for supplying a second signal as a function of a switching state of the second switching device and a comparator device for determining a difference in the switching times of the switching devices on the basis of the determined signals.

It is possible in this way to easily and accurately determine a difference between the actual switch-on times of the switching devices of a half-bridge. A shift of a current in the connected consumer may therefore be determined early and accurately. To prevent damage, appropriate countermeasures may be initiated with ease.

The switching devices may fundamentally include any type of controllable switch, for example, a semiconductor switch such as a bipolar transistor, in particular including an isolated gate electrode (IGBT). One of the switching devices preferably includes a field effect transistor, the assigned scanning device being configured to determine a closed switching state when a voltage between a gate terminal and a source terminal of the field effect transistor is below a predetermined threshold value.

This determination may be carried out easily and accurately with the aid of a comparator, for example. This approach may be undertaken more easily and less expensively than the determination of a current flowing through the switching device with the aid of a current measurement, for example. The comparator may be integrated using semiconductor technology into the half-bridge or the control device or both, thereby reducing manufacturing costs.

In a first variant, the comparator device may have a similar design. The comparator device may therefore include an integrating comparator, which is configured to supply a voltage on the basis of the determined signals, the deviation in this voltage from a predetermined potential being a measure for the difference in the switch-on times. For this purpose, the signals are integrated over time with different signs. If the signals have the same length, i.e., if the switch-on times of the switching devices are the same, then the voltage supplied before the first signal would be of the same value as that after the second signal. In other words, the voltage at the output of the integrating comparator therefore does not on the average change over time.

In a second variant, the comparator device has a digital design. The comparator device may include a digital counter, which is configured to increment a uniform clock signal during the first signal and to decrement it during the second signal or vice versa, whereby the deviation of the count from a predetermined count is a measure for the difference in the switch-on times. Here again, the count does not change over time if the switch-on times of the switching devices are the same. A conflict between first and second signals being applied simultaneously may be ruled out since it is ensured otherwise that both switching devices on a half-bridge are not activated simultaneously.

In one specific embodiment, the switching devices are activated periodically, each period including an activation of the first and second switching devices. The comparison of the signals with the aid of one of the two described variants may take place over several periods. It is therefore possible to accurately detect even the most minute differences between the switch-on times. Sporadic differences in the switch-on times in one direction or the other may be averaged out by considering multiple periods.

The switching devices are preferably encompassed by a half-bridge or a bridge branch of an H-bridge. Such circuits are used, for example, in integrated controls for operating electric motors, in particular brushless electric motors. In a particularly preferred specific embodiment, the control device is configured to activate the switching devices in such a way that the difference between the switch-on times is minimized.

The control device may also be configured to minimize a dead time during which neither the first nor the second switching device is being activated. A high power loss may occur in the time between switch-off of the one switching device and on the switch-on of the other switching device, in particular in an application in which an inductive load, such as an electric motor, is connected at the output, if the inductive component of the load forces a continuous current flow, which is diverted in a diode function of one of the switching devices. If field effect transistors, in particular MOSFETs, are used as the control devices, a current may also flow opposite to the forward direction if the transistor is blocking. If the activations of the switching devices are adapted dynamically to minimize the dead time, then an asymmetry between the switch-on times may occur or may be increased by this adaptation. The dead times may be minimized by taking into account the difference in the switch-on times without risking the described shift of the current in the load.

BRIEF DESCRIPTION OF THE DRAWINGS

FIG. 4 shows sequences on the control from FIG. 1.

DETAILED DESCRIPTION

Figure 1:
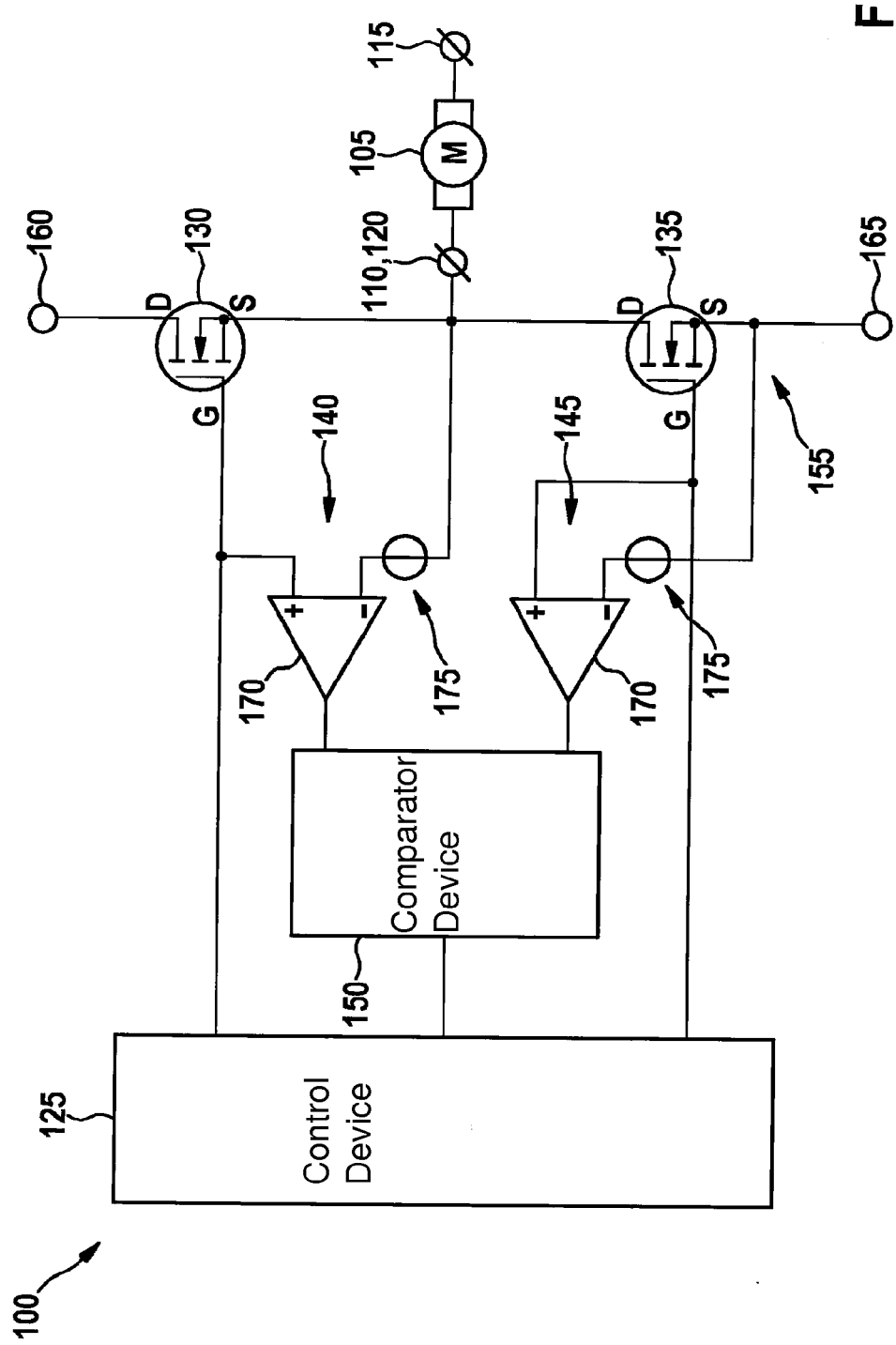
FIG. 1 shows a circuit diagram of a control for an electrical consumer.

FIG. 1 shows a circuit diagram of a control 100 for an electrical consumer 105. Electrical consumer 105 includes a first terminal 110 and a second terminal 115 between which a current may flow. Control 100 includes a control device 125, a first switching device 130, a second switching device 135, a first scanning device 140, a second scanning device 145 and a comparator device 150.

Switching devices 130 and 135 together form a half-bridge 155. First switching device 130 is configured to control a current flow from a first potential 160 to output 120, and second switching device 135 is configured to control a current flow from output 120 to a second potential 165. In the specific embodiment illustrated here, first terminal 110 of consumer 105 is connected to output 120. Second terminal 115 of consumer 105 may be connected to a predetermined potential, which is preferably between the potentials 160 and 165 or to an additional half-bridge 155, for example, which is configured corresponding to half-bridge 155 and is controlled in particular antiparallel to allow current to pass through consumer 105 in one direction or the other.

In the specific embodiment shown here, switching devices 130 and 135 are provided as MOSFETs, but other controllable transistors or switches may also be used. In particular switching devices 130 and 135 are both designed as N-channel switches, first switching device 130 being designed as a drain circuit and second circuit 135 being designed as a source circuit. This constellation may be advantageous for reasons of cost, but different switching behaviors, in particular different latency times of switching devices 130 and 135, may also be caused by otherwise identical switching devices 130 and 135. Control device 125 is connected to switching devices 130 and 135 for control.

Scanning devices 140 and 145 each include a comparator 170 and a voltage source 175. First scanning device 140 delivers a positive first signal when the voltage between the gate terminal and the source terminal of first switching device 130 drops below the voltage of assigned voltage source 175. Second scanning device 145 delivers a positive second signal when the voltage between the drain terminal and the gate terminal of second switching device 135 drops below the voltage of assigned voltage source 175. In the specific embodiment presented here, both signals are positive when the respective assigned switching device 130, 135 is in the closed switching state. However, the polarities may also be changed, so that negative signals are the result when switching devices 130 and 135 are each in a conducting state.

The signals of scanning devices 140 and 145 are supplied to comparator device 150, which is configured to determine switch-on times of different lengths of switching devices 130 and 135 on the basis of the difference in the lengths of the first and second signals. The result of this determination is preferably supplied to control device 125. Control device 125 may be configured to adapt the control signals supplied for switching devices 130 and 135 to preferably minimize the determined difference.

Furthermore, control device 125 may be configured to minimize the dead time, during which neither first switching device 130 nor second switching device 135 is in the closed switching state. This minimization may be used in periodic activation of switching devices 130 and 135, for example, in particular, within the scope of a pulse width modulation (PWM).

Figure 2:
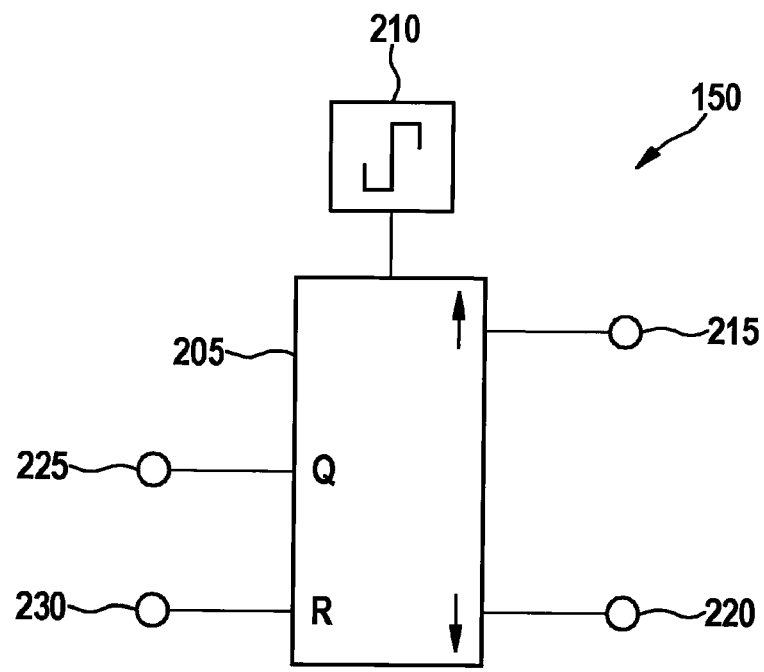
FIG. 2 shows a comparator device for the control of FIG. 1 in a first specific embodiment.

FIG. 2 shows a comparator device 150 for control 100 of FIG. 1 in a first digital specific embodiment. Comparator device 150 shown here includes a digital counter 205, which is configured to increment or decrement a preferably uniform clock signal of a clock generator 210. If a corresponding signal is applied to a first control input 215, the clock signal of clock generator 210 is incremented and if a signal is applied to a second control input 220, the clock signal is decremented. The count directions may also be reversed. Control inputs 215 and 220 are connected to outputs of scanning devices 140 and 145 to receive the first and second signals they supply. Since the supplied signals correspond to switch-on times of switching devices 130 and 135 and the two switching devices 130, 135 should not be in the closed switching state in order to prevent a short circuit between first potential 160 and second potential 165, the two signals at control inputs 215 and 220 are not active simultaneously. Therefore, there is no conflict if counter 205 has to increment and decrement simultaneously.

Counter 205 supplies its count at an output 225. Output 225 is preferably connected to control device 125 of control 100 from FIG. 1. In a simple specific embodiment, output 225 signals only whether or not the count of counter 205 has a predetermined value. In one refinement, it is also possible to signal whether the count is within a predetermined range around the predetermined value. The predetermined count may be set with the aid of a signal at a reset input 230, for example, and may be zero in particular. Reset input 230 may be controlled by control device 125 in particular, or a reset signal may be derived from one of the control signals of switching devices 130, 135 to determine only the switching times from one period. If, for example, first switching device 130 and then second switching device 135 are each activated for a predetermined period of time after setting the count, digital counter 205 will first increment the number of steps and then decrement the number of steps. If the two switching devices 130, 135 have been closed for equal amounts of time, the instantaneous count of counter 205 will again correspond to the count set initially. Otherwise the switch-on times of switching devices 130, 135 would be of different lengths.

In one preferred specific embodiment, the result of this determination is made available as an absolute count at output 225, so that the deviation from the predetermined count may be determined by control device 125. Switching devices 130, 135 are usually activated in alternation, and counter 205 may be reset periodically to the predetermined count after one or multiple periods.

Figure 3:
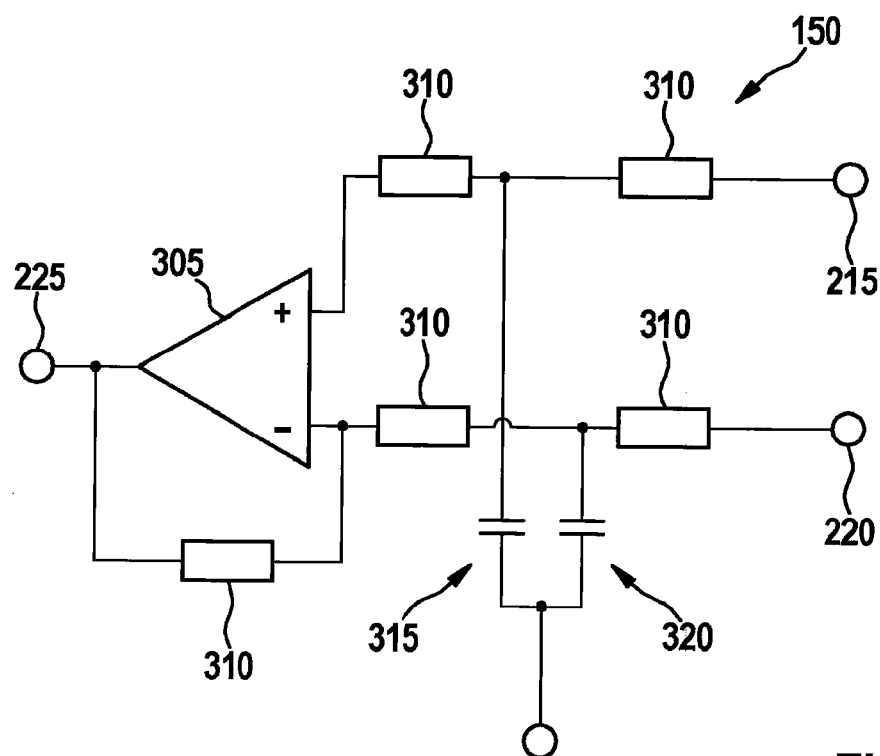
FIG. 3 shows a comparator device for the control of FIG. 1 in a second specific embodiment.

FIG. 3 shows a comparator device 150 for control 100 of FIG. 1 in a second similar specific embodiment, which may be used in control 100 as an alternative to the specific embodiment shown in FIG. 2. Control inputs 215 and 220 and output 225 are assumed from the specific embodiment shown in FIG. 2, reset input 230 being omitted. Comparator device 150 shown here is designed as an integrating comparator around an amplifier 305. A voltage controlled by a number of resistors 310 is integrated in a first capacitor 315 over time as a function of the first signal at first control input 215. Similarly, in a second capacitor 320, the second signal at second control input 220 is integrated over time. Integration of the first signal is positive and that of the second signal is negative, an inverse allocation of signals to signs also being used. A voltage whose deviation from a predetermined value represents the difference in switch-on times of switching devices 130 and 135 is supplied at output 225 of comparator device 150. The predetermined value corresponds to the predetermined count of counter 205 in the specific embodiment shown in FIG. 2.

FIG. 4 shows sequences on control 100 in FIG. 1. Time is plotted on the horizontal axis and a value or a signal is plotted on the vertical axis. A first signal 405 is supplied by first scanning device 140 in FIG. 1 and is applied to first control input 215 of comparator devices 150 in one of the various specific embodiments of FIGS. 2 and 3. A second signal 410 is similarly supplied by second scanning device 145 and is applied to second control input 220 of comparator device 150. A comparator signal 415 represents the count of digital counter 205 in the digital variant of comparator device 150 in FIG. 2. In the analog variant in FIG. 3, it represents a voltage at output 225 of amplifier 305.

At a point in time t0, the two signals 405 and 410 are inactive, respective switching devices 130 and 135 are therefore not closed, and comparator signal 415 assumes a predetermined count 420. This count may be defined as a zero point in particular.

At a point in time t1, first switching device 130 is activated and comparator signal 415 increases linearly over time. At a point in time t2, first signal 405 is deactivated again. Up to a point in time t3, a dead time elapses, during which none of signals 405 or 410 is active. During this time, comparator signal 415 remains at its value assumed at point in time t2.

After activation of second signal 410 at point in time t3, comparator signal 415 declines at the same rate at which it previously rose between points in time t1 and t2. At a point in time t4, comparator signal 415 in the example shown here reaches count 420. However, second signal 410 remains active for a longer period of time, namely up to point in time t5, and is deactivated only then, whereupon comparator signal 415 is again held at its instantaneous value. The value of comparator signal 415 after point in time t5 is less than count 420, which indicates that second signal 410 was longer than first signal 405. In the opposite case, when first signal 405 is longer than second signal 410, the value of comparator signal 415 is above count 420 after point in time t5, when the two signals 405, 410 are deactivated again. In load cases, the absolute amount of the interval between comparator signal 415 and count 420 is a measure of the size of the deviation of the durations of signals 405 and 410.

What is claimed is:

1. A control for an electrical consumer, comprising:
   a first switching device for connecting an output for the consumer to a first potential;
   a second switching device for connecting the output to a second potential;
   a control device for activating the switching devices;
   a first scanning device for supplying a first signal as a function of a switching state of the first switching device, the length of the first signal corresponding to a duration of a switch-on time of the first switching device;
   a second scanning device for supplying a second signal as a function of a switching state of the second switching device, the length of the second signal corresponding to a duration of a switch-on time of the second switching device; and
   a comparator device for determining a difference in the durations of the switch-on times of the first and second switching devices on the basis of the difference in lengths of the first and second signals, wherein the difference in the durations of the switch-on times is determined based on a comparison of the first and second signals over multiple time periods, each time period corresponding to an activation cycle of the first and second switching devices.

2. The control as recited in claim 1, wherein:
   one of the first and second switching devices includes a field effect transistor, and
   the one of the first and second scanning devices associated with the one of the first and second switching devices that includes the field effect transistor is configured to determine a closed switching state when a voltage between a gate terminal and a source terminal of the field effect transistor is below a predetermined threshold value.

3. The control as recited in claim 1, wherein the comparator device includes an integrating comparator that is configured to supply an output voltage on the basis of the first and second signals, a deviation of which from a predetermined potential is a measure for the difference in the length of the switch-on times, wherein the integrating comparator includes an amplifier and one or more resistors and determines the output voltage by integrating a first voltage controlled by the one or more resistors over time as a function of the first signal and integrating a second voltage controlled by the one or more resistors over time as a function of the second signal.

4. The control as recited in claim 1, wherein the comparator device includes a digital counter that is configured to increment a uniform clock signal during the first signal and to decrement the clock signal during the second signal, a deviation of the count from a predetermined count being a measure for the difference in the switch-on times.

5. The control as recited in claim 1, wherein the control device activates periodically the first and second switching devices within a scope of a pulse width modulation.

6. The control as recited in claim 1, wherein the first and second switching devices are encompassed by a half-bridge.

7. The control as recited in claim 1, wherein the first and second switching devices are encompassed by a bridge branch of an H-bridge.

8. The control as recited in claim 1, wherein the control device activates the first and second switching devices in such a way that the difference between the durations of the switch-on times is minimized.

9. The control as recited in claim 1, wherein the control device is configured to minimize a dead time, during which neither the first switching device nor the second switching device is activated.

10. The control as recited in claim 1, wherein the difference in the durations of the switch-on times is determined based on an average of the difference in lengths of the first and second signals over the multiple time periods.

* * * * *